United States Patent
Toyama et al.

(10) Patent No.: US 7,212,973 B2
(45) Date of Patent: May 1, 2007

(54) ENCODING METHOD, ENCODING APPARATUS, DECODING METHOD, DECODING APPARATUS AND PROGRAM

(75) Inventors: Keisuke Toyama, Tokyo (JP); Shiro Suzuki, Kanagawa (JP); Minoru Tsuji, Chiba (JP); Masayuki Nishiguchi, Kanagawa (JP)

(73) Assignee: Sony Corporation, Tokyo (JP)

(*) Notice: Subject to any disclaimer, the term of this patent is extended or adjusted under 35 U.S.C. 154(b) by 797 days.

(21) Appl. No.: 10/344,624

(22) PCT Filed: Jun. 11, 2002

(86) PCT No.: PCT/JP02/05808

§ 371 (c)(1),
(2), (4) Date: Jul. 3, 2003

(87) PCT Pub. No.: WO02/103685

PCT Pub. Date: Dec. 27, 2002

(65) Prior Publication Data

US 2005/0261893 A1    Nov. 24, 2005

(30) Foreign Application Priority Data

Jun. 15, 2001   (JP) ............................. 2001-182383

(51) Int. Cl.
  *G10L 19/02* (2006.01)
  *G06K 9/38* (2006.01)
(52) U.S. Cl. ................ 704/500; 704/230; 375/240.03; 382/244
(58) Field of Classification Search ............ 704/200.1, 704/222, 230, 500–504; 382/244
See application file for complete search history.

(56) References Cited

U.S. PATENT DOCUMENTS

| | | | |
|---|---|---|---|
| 5,497,246 A | * | 3/1996 | Abe ............................ 382/252 |
| 5,737,367 A | | 4/1998 | Wuppermann et al. |
| 5,781,586 A | * | 7/1998 | Tsutsui ....................... 375/241 |
| 6,285,796 B1 | * | 9/2001 | Acharya et al. ............. 382/246 |
| 6,664,913 B1 | * | 12/2003 | Craven et al. .............. 341/200 |

FOREIGN PATENT DOCUMENTS

| | | |
|---|---|---|
| EP | 1 085 502 | 3/2001 |
| JP | 08-16195 | 1/1996 |

(Continued)

OTHER PUBLICATIONS

European Search Report dated Sep. 11, 2006.

(Continued)

*Primary Examiner*—Abul K. Azad
(74) *Attorney, Agent, or Firm*—Sonnenschein Nath & Rosenthal LLP

(57) ABSTRACT

In a quantization step information encoding unit, an average value of the quantization step information is found in an approximate shape extraction unit (20), first of all, from one set of a given number of unitary quantization units to another. In an approximate shape encoding unit (21), the approximate shape information is vector-quantized. In a residual signal computing unit (22), the residual signals between the quantization step information and the quantized approximate shape vector are computed. In a residual signal encoding unit (23), the residual signals are variable length encoded, and the so encoded residual signals and the vector quantized approximate shape information are output.

33 Claims, 14 Drawing Sheets

FOREIGN PATENT DOCUMENTS

| | | |
|---|---|---|
| JP | 09-18348 | 1/1997 |
| JP | 09-34493 | 2/1997 |
| JP | 09-214346 | 8/1997 |
| JP | 09-261066 | 10/1997 |
| JP | 09-261068 | 10/1997 |
| JP | 11-242499 | 9/1999 |
| JP | 2001-92499 | 4/2001 |
| JP | 2002-41097 | 2/2002 |

OTHER PUBLICATIONS

Peter Craven and Michael Gerzon, Lossless Coding for Audio Discs; J. Audio Eng. Socl, vol. 44, No. 9, Sep. 1996.

* cited by examiner

| rIDWL | codeword | length |
|---|---|---|
| −1 | 10 | 2 |
| 0 | 0 | 1 |
| 1 | 110 | 3 |
| other | 111+original(3bit) | 6 |

FIG.11

| rIDWL | codeword | length |
|---|---|---|
| -3 | 1110 | 4 |
| -2 | 101 | 3 |
| -1 | 011 | 3 |
| 0 | 00 | 2 |
| 1 | 010 | 3 |
| 2 | 100 | 3 |
| 3 | 110 | 3 |
| other | 1111+original(6bit) | 10 |

ENCODING METHOD, ENCODING APPARATUS, DECODING METHOD, DECODING APPARATUS AND PROGRAM

BACKGROUND OF THE INVENTION

This invention relates to an encoding apparatus, an encoding method, a decoding apparatus, a decoding method, an encoding program and a decoding program. More particularly, it relates to an encoding apparatus, an encoding method, a decoding apparatus, a decoding method, an encoding program and a decoding program, in which digital data, such as digital audio signals, are encoded with high efficiency encoding and transmitted or recorded on a recording medium, and in which the digital data are received or reproduced for decoding on the side decoder.

A variety of techniques exist for high efficiency encoding of digital audio signals or speech signals. Examples of these techniques include a non-blocking frequency spectrum splitting system, exemplified by spectrum-splitting encoding (sub-band coding) and a blocking frequency spectrum splitting system, exemplified by transform coding.

In the non-blocking frequency spectrum splitting system, audio signals on the time axis are split into plural frequency bands and encoded without blocking. In the blocking frequency spectrum splitting system, the signals on the time axis are transformed into signals on the frequency axis, by orthogonal transform, and the frequency domain signals are split into plural frequency bands, that is, the coefficients obtained on orthogonal transform are grouped from one preset frequency band to another, and the encoding is carried out from one such frequency band to another.

For improving the encoding efficiency further, there is also proposed a technique of high efficiency encoding consisting in the combination of the aforementioned non-blocking frequency spectrum splitting system and the blocking frequency spectrum splitting system. With this technique, the time domain signals are split into plural frequency bands by means of the sub-band coding, and the signals of the respective bands are orthogonal-transformed into those on the frequency axis, and the frequency domain signals, resulting from the orthogonal transform, are encoded from one frequency band to another.

In splitting the time-domain signals into plural frequency bands, a quadrature mirror filter (QMF), for example, is preferentially used, because it assures facilitated processing and cancels out the aliasing distortion. Details of the frequency spectrum splitting by this QMF may be found in R. E. Crochiere, Digital coding of speech in subbands, Bell Syst. Tech. J. Vol. 55, No. 8, 1976.

As a technique for splitting the frequency spectrum, there is also a polyphase quadrature filter (PQF) which represents a technique of dividing the frequency spectrum into equal-width frequency ranges. Details of this PQF are discussed in Joseph H. Rothweiler, Polyphase Quadrature Filters—A new subband coding technique, ICASSP 83 BOSTON.

There are known techniques for orthogonal transform including the technique of dividing the digital input audio signals into blocks of a predetermined time duration, by way of blocking, and processing the resulting blocks using a Discrete Fourier Transform (DFT), discrete cosine transform (DCT) or modified DCT (MDCT) to convert the signals from the time axis to the frequency axis.

Discussions of a MDCT may be found in J. P. Princen and A. B. Bradley, Subband/Transform Coding Using Filter Bank Based on Time Domain Aliasing Cancellation, ICASSP, 1987, Univ. of Surrey Royal Melbourne Inst. of Tech.

By quantizing the signals, divided from band to band, using a filter or orthogonal transform, it is possible to control the band susceptible to quantization noise and, by exploiting such properties as masking effect, it is possible to achieve psychoacoustically more efficient encoding. If, prior to quantization, the signal components of the respective bands are normalized using the maximum absolute value of the signal components of each band, the encoding efficiency may be improved further.

In quantizing the frequency components, resulting from the division of the frequency spectrum, it is known to divide the frequency spectrum into widths which take characteristics of the human acoustic system into account. That is, audio signals are divided into plural bands, such as 32 bands, in accordance with band widths increasing with increasing frequency.

In encoding the band-based data, bits are allocated fixedly or adaptively from band to band. When applying adaptive bit allocation to coefficient data resulting from MDCT, the MDCT coefficient data of res=bands, obtained on MDCT processing, applied to block-based signals, are encoded with an adaptively allocated number of bits.

As bit allocation techniques, there are currently known a technique of allocating the bits based on the band-based signal magnitude from one band to another, sometimes referred to below as a first bit allocation technique, and a technique of allocating th bits in a fixed manner, based on the required band-based signal-to-noise ratio, obtained by taking advantage of the psychoacoustic masking effect, sometimes referred to below as a second bit allocation technique.

Details of the first bit allocation technique may be found in R. Zelinsky and P. Noll, Adaptive Transform Coding of Speech Signals, IEEE Transactions of Acoustics, Speech and Signal Processing, vol. ASSP-25, No. 4, August 1977.

Details of the second bit allocation technique may be found in M. A. Kransner MIT, The critical band coder digital encoding of the perceptual requirements of the auditory system, ICASSP 1980.

With the first bit allocation technique, the quantization noise spectrum becomes flatter, with the noise energy being minimized. However, the noise level perceived by the listener is not optimum because the psychoacoustic masking effect is not exploited. On the other hand, if, with the second bit allocation technique, the energy is concentrated in a certain frequency, as when a sine wave is input, characteristic values are not optimum because of the fixed bit allocation.

With this in mind, there has been proposed a high efficiency encoding apparatus in which the total number of bits usable for bit allocation is divided into a predetermined number of bits allocated from one sub-block to another and a variable number of bits which depends on the magnitude of the signals of the respective blocks, with the division ratio depending on a signal relevant to the input signal, in such a manner that the proportion of the fixed bit allocation becomes higher the smoother the spectrum of the input signal.

With this method, in case the signal energy is concentrated in a specified spectral component, as when the input signal is a sine wave, a large number of bits are allocated to a block of the spectral component, thereby appreciably improving overall signal-to-noise characteristics. The human auditory system is more sensitive to the signals having steep spectral components, so that, if the signal-to-noise characteristics are improved as described above, not only measured values but also the sound as perceived by the listener may be effectively improved.

There are also other methods proposed in connection with the bit allocation. If more elaborate models simulating the human auditory system are developed and the ability of the encoding apparatus is improved, it would be possible to achieve the encoding with psychoacoustically higher efficiency.

If, with the use of DFT or DCT as a method for transforming waveform signals into spectral signals, the transform is carried out using a time block consisting of M samples, M independent real-number data are obtained. However, since a given time block is overlapped with an overlap of a preset number M1 of samples with both neighboring blocks, with a view to reducing the junction distortion between neighboring time blocks or frames, the encoding method exploiting DFT or DCT quantizes and encodes M real-number data for (M–M1) samples on an average.

If MDCT is used as a method for transforming time-domain signals into spectral signals, M independent real-number data are obtained from 2M samples resulting from overlap with M samples from both neighboring blocks. Thus, in the present case, M real-number data are quantized and encoded for M samples on an average. In this case, the decoding apparatus re-constructs the waveform signals by summing waveform elements, obtained on inverse transform in the respective blocks of the codes obtained on MDCT as described above, as the waveform elements are caused to interfere with one another.

In general, if the time block (frame) for transform is lengthened, the frequency resolution of the spectrum is improved, such that the energy is concentrated in a specified spectral component. Thus, with the use of MDCT in which a block length used for transform is elongated by overlap with one half each of the neighboring blocks, with the number of the resulting spectral components not increasing as compared to the number of the original time samples, the encoding efficiency is higher than in case of using DFT or DCT. Moreover, the block-to-block distortion of the waveform signals may be reduced by providing a sufficiently long overlap between the neighboring blocks.

In constructing an actual codeword, the quantization step information, as the information representing quantization steps used in quantization, and the normalization information, as the information representing the coefficient used in normalizing the respective signal components, are encoded with preset numbers of bits, from one frequency band for normalization or quantization to another, and subsequently the normalized and quantized spectral signals are encoded.

It is noted that the IDO/IEC 11172-3: 1993(E), 1993 states the high efficiency encoding system in which different numbers of bits representing the quantization step information are used from one frequency band to another. Specifically, the number of bits representing the quantization step information is smaller for higher frequency bands.

FIG. 1 shows an example of a structure of a conventional encoding apparatus 100 for splitting the audio signals into plural frequency bands and encoding the resulting band-based signals. The audio signals for encoding are input to a spectrum splitting unit 101 so as to be split into for example signals of four frequency bands.

It is noted that frequency spectrum splitting in the spectrum splitting unit 101 may be by a filter, such as the aforementioned QMF or PQF, or by orthogonal transform, such as MDCT, with the resulting spectral signals being grouped from band to band by way of the frequency spectrum splitting.

Meanwhile, the widths of the bands, termed herein the encoding units, into which the spectrum of the audio signals is split in the spectrum splitting unit 101, may be uniform, or non-uniform in keeping with the critical bands. Although the audio signals are split into four encoding units, in FIG. 1, the number of the encoding units is not limited thereto.

The signals split into the four encoding units, referred to below as first to fourth encoding blocks, are routed to a quantization step determining unit 103 each preset time block or frame. The signals of the first to fourth encoding blocks are also routed to normalization units $102_1$ to $102_4$.

The normalization units $102_1$ to $102_4$ extract the signal components of the maximum absolute value from the respective signal components forming the signals of the input first to fourth encoding blocks, and set the coefficients corresponding to the extracted signal components as normalization coefficients of the first to fourth encoding blocks. The respective signal components, making up the signals of the first to fourth encoding blocks, are normalized, that is divided, by the normalization units $102_1$ to $102_4$, with values corresponding to the normalization coefficients of the first to fourth encoding blocks, respectively. Thus, in the present case, the normalized data resulting from normalization ranges from –1.0 to 1.0.

The normalized data are output from the normalization units $102_1$ to $102_4$ to quantizing units $104_1$ to $104_4$, respectively. The normalization coefficients of the first to fourth encoding blocks are also output from the normalization units $102_1$ to $102_4$ to a multiplexer 105.

The quantizing units $104_1$ to $104_4$ are supplied not only with normalized data of the first to fourth encoding blocks, from the normalization units $102_1$ to $102_4$, but also with the quantization step information, which specifies the quantization step in quantizing the normalized data of the first to fourth encoding blocks, from the quantization step determining unit 103.

That is, the quantization step determining unit 103 determines the quantization step in quantizing the normalized data from the first to fourth encoding blocks, based on signals of the first to fourth encoding blocks from the frequency spectrum splitting unit 101, and outputs the quantization step information of the first to fourth encoding blocks, corresponding to the so determined quantization step, to the quantizing units $104_1$ to $104_4$, while outputting the quantization step information to the multiplexer 105.

In the quantizing units $104_1$ to $104_4$, the normalized data of the first to fourth encoding blocks are quantized with the quantization step, corresponding to the quantization step information of the first to fourth encoding blocks, and encoded, and the resulting quantization coefficients of the first to fourth encoding blocks are output to the multiplexer 105. In the multiplexer 105, the quantization coefficients, quantization step information and the normalization information of the first to fourth encoding blocks are encoded as necessary and multiplexed to produce encoded data which are transmitted over a transmission channel or recorded on a recording medium, not shown.

It is also possible for the quantization step determining unit 103 to determine the quantization step, based not only on the signals resulting from the frequency spectrum splitting, but also on normalized data, or taking into account the acoustic phenomena, such as masking effect.

An illustrative structure of the decoding apparatus 120 for decoding the encoded data output from the encoding apparatus 100 constructed as described above is shown in FIG. 2, in which encoded data are input to a demultiplexer 121 and decoded so as to be separated into the quantization coefficients, quantization step information and the normalization information of the first to fourth encoding blocks. The quantization coefficients, quantization step information and the normalization information of the first to fourth encoding blocks are supplied to signal component constructing units $122_1$ to $122_4$ associated with the respective encoding units.

In the signal component constructing units $122_1$, the quantization coefficients of the first encoding unit are inverse quantized, with the quantization step corresponding to the quantization step information of the first encoding unit, to produce the normalized data of the first encoding unit. In the signal component constructing units $122_2$, the normalized data of the first encoding unit are multiplied with a value corresponding to the normalization information of the first encoding unit to decode the signals of the first encoding unit, which are then output to a band synthesizing unit 123.

Similar operations are executed in the signal component constructing units $122_2$ to $122_4$ to decode the signals of the second to fourth encoding blocks, which are output to the band synthesizing unit 123. In this band synthesizing unit 123, the signals of the first to fourth encoding blocks are synthesized to restore the original audio signals.

Meanwhile, since the quantization step information is contained in the encoded data supplied (transmitted) from the encoding apparatus 100 of FIG. 1 to the decoding apparatus 120 of FIG. 2, the acoustic model used in the decoding apparatus can be set optionally. That is, the quantization step for each encoding unit can be set freely in the encoding apparatus, such that attempts may be made to improve the sound quality or the compression ratio, in keeping with the improved performance ability of the encoding apparatus or elaborateness of the acoustic model, without the necessity of changing the decoding apparatus.

However, in this case, the number of bits for encoding the quantization step information itself is increased, so that difficulties are met in improving the overall encoding efficiency beyond a certain value.

Although it is possible for the decoding apparatus to determine the quantization step information from e.g., the normalization information, instead of directly encoding the quantization step information, the relation between the normalization information and the quantization step information is set at a time point of setting the standard or design parameters, with the consequence that difficulties may be encountered in introducing the control of the quantization step based on a further advanced acoustic model that may be developed in future. In addition, if there is a certain tolerance in the compression ratio to be implemented, it is necessary to set the relation between the normalization information and the quantization step information from one compression ratio to another.

SUMMARY OF THE INVENTION

In view of the above-depicted status of the art, it is an object of the present invention to provide an encoding apparatus, an encoding method, a decoding apparatus, a decoding method, an encoding program and a decoding program, in which the encoding efficiency of the audio signals as the direct subject-matter of encoding and that of the subsidiary information, such as quantization step information or the normalization information, which is not the direct subject-matter of encoding, may be improved while free setting of the quantization step in the encoding apparatus is allowed.

The present invention provides an encoding apparatus for encoding the main information of the audio and/or video signals, which is the direct subject-matter of encoding, and the subsidiary information, which is not the direct subject-matter of encoding, in which the apparatus includes approximate shape computing means for computing the approximate shape information of the subsidiary information, approximate shape encoding means for quantizing and encoding the approximate shape information, error computing means for computing the quantization error in the approximate shape encoding means, and error encoding means for encoding the quantization error in a lossless fashion without losing the information. The approximate shape information encoded by the approximate shape encoding means and the quantization error encoded by the error encoding means are output.

With the present encoding apparatus, the approximate shape information of the subsidiary information for the audio and/or video signals is quantized and encoded, in encoding the subsidiary information, while the quantization error is encoded in a lossless fashion, without losing the information.

The present invention also provides an encoding method for encoding the main information of the audio and/or video signals, which is the direct subject-matter of encoding, and the subsidiary information, which is not the direct subject-matter of encoding, in which the method includes an approximate shape computing step of computing the approximate shape information of the subsidiary information, an approximate shape encoding step of quantizing and encoding the approximate shape information, an error computing step of computing the quantization error, and an error encoding step of encoding the quantization error in a lossless fashion without losing the information. The approximate shape information encoded by the approximate shape encoding step and the quantization error encoded by the error encoding step are output.

With the present encoding method, the approximate shape information of the subsidiary information for the audio and/or video signals is quantized and encoded, in encoding the subsidiary information, while the quantization error is encoded in a lossless fashion, without losing the information.

The present invention also provides a decoding apparatus for decoding encoded audio and/or video signals in which the approximate shape information of the subsidiary information that is not the direct subject-matter of encoding is encoded in an encoding apparatus and in which a quantization error in encoding the approximate shape information is encoded in a lossless fashion without losing the information, the approximate shape information and the quantization error being input to and decoded by the decoding apparatus. The decoding apparatus includes error decoding means for decoding the quantization error of the subsidiary information, approximate shape decoding means for decoding the approximate shape information of the subsidiary information, and synthesizing means for synthesizing the decoded quantization error and the decoded approximate shape information.

The present decoding apparatus is supplied with the subsidiary information for the audio and/or video signals, in which, in encoding the subsidiary information, the approximate shape information of the subsidiary information is quantized and encoded, while the quantization error is encoded in a lossless fashion, without losing the information. The decoding apparatus decodes and synthesizes the quantization error and the approximate shape information of the subsidiary information.

The present invention also provides a decoding method for decoding encoded audio and/or video signals in which the approximate shape information of the subsidiary information that is not the direct subject-matter of encoding is encoded in an encoding apparatus and in which a quantization error in encoding the approximate shape information is encoded in a lossless fashion without losing the information, the approximate shape information and the quantization error being input and decoded. The decoding method includes an error decoding step of decoding the quantization error of the subsidiary information, an approximate shape decoding step of decoding the approximate shape information of the subsidiary information, and a synthesizing step of synthesizing the decoded quantization error and the decoded approximate shape information.

In the present decoding method, the subsidiary information for the audio and/or video signals is input, in which, in encoding the subsidiary information in the encoding apparatus, the approximate shape information of the subsidiary information is quantized and encoded, while the quantization error is encoded in a lossless fashion, without losing the information. The quantization error and the approximate shape information of the subsidiary information are decoded and synthesized together.

The present invention provides an encoding program for encoding the main information of the audio and/or video signals, which is the direct subject-matter of encoding, and the subsidiary information, which is not the direct subject-matter of encoding, in which the encoding program includes an approximate shape computing step of computing the approximate shape information of the subsidiary information, an approximate shape encoding step of quantizing and encoding the approximate shape information, an error computing step of computing the quantization error, and an error encoding step of encoding the quantization error in a lossless fashion without losing the information. The approximate shape information encoded by the approximate shape encoding step and the quantization error encoded by the error encoding step are output.

With the present encoding program, the approximate shape information of the subsidiary information for the audio and/or video signals is quantized and encoded, in encoding the subsidiary information, while the quantization error is encoded in a lossless fashion, without losing the information.

The present invention also provides a decoding program for decoding the encoded audio and/or video signals, in which the approximate shape information of the subsidiary information that is not the direct subject-matter of encoding is encoded and in which a quantization error in encoding the approximate shape information is encoded in a lossless fashion without losing the information, the approximate shape information and the quantization error being input and decoded. The decoding program includes an error decoding step of decoding the quantization error of the subsidiary information, an approximate shape decoding step of decoding the approximate shape information of the subsidiary information, and a synthesis step of synthesizing the decoded quantization error and the decoded approximate shape information.

With the present decoding program, the subsidiary information in which the approximate shape information of the subsidiary information for the audio and/or video signals is quantized and encoded, in encoding the subsidiary information for the audio and/or video signals in the encoding apparatus, and in which the quantization error is encoded in a lossless fashion, without losing the information, is input, and the quantization error and the approximate shape information of the subsidiary information are decoded and synthesized together.

Other objects, features and advantages of the present invention will become more apparent from reading the embodiments of the present invention as shown in the drawings.

BRIEF DESCRIPTION OF THE DRAWINGS

FIG. 11 illustrates a specified example of a variable length codeword table for encoding the quantization step information residual signal.

DETAILED DESCRIPTION OF THE PRESENTLY PREFERRED EMBODIMENTS

Figure 1:
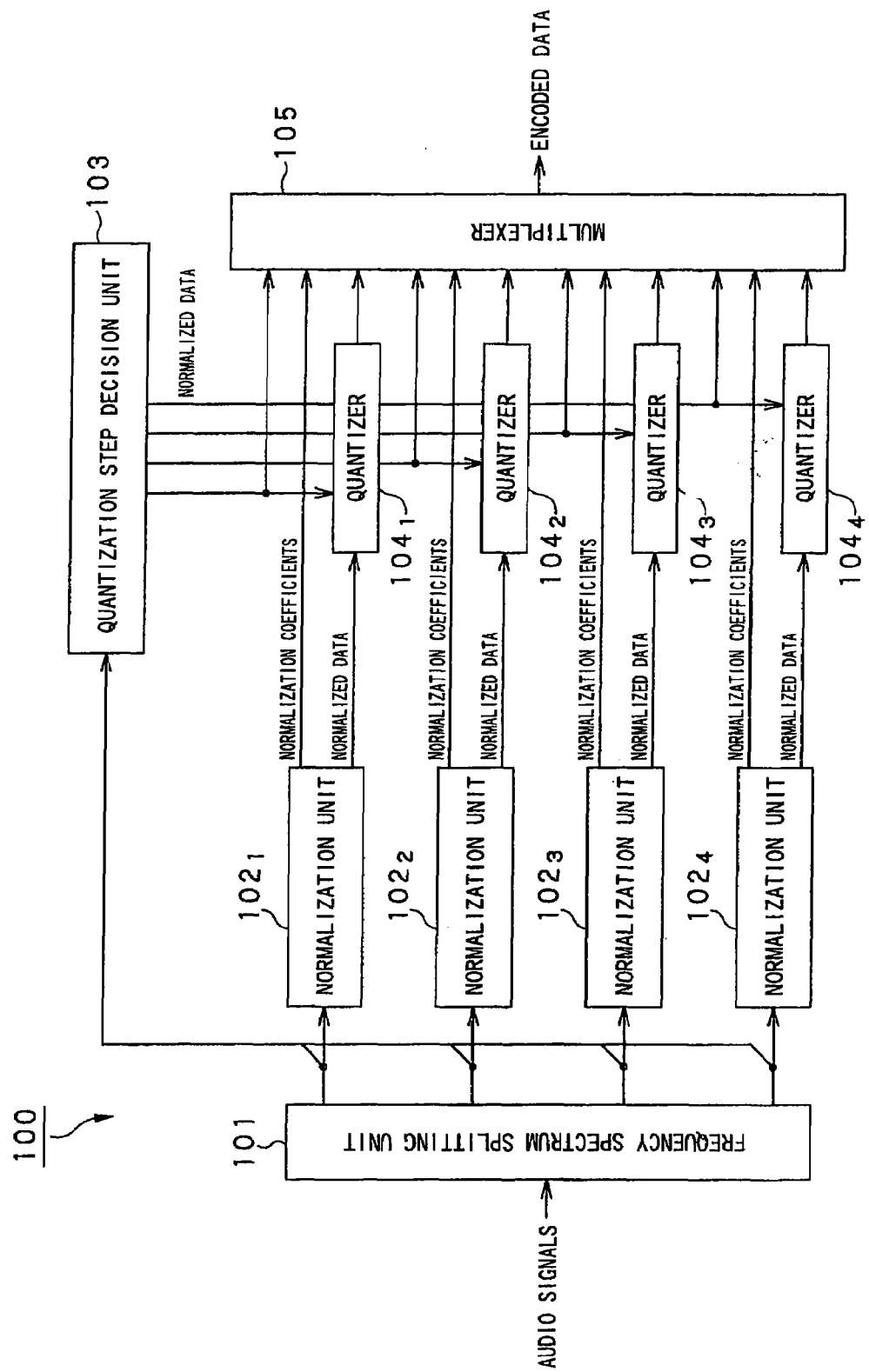
FIG. 1 illustrates the structure of a conventional encoding apparatus.
Figure 2:
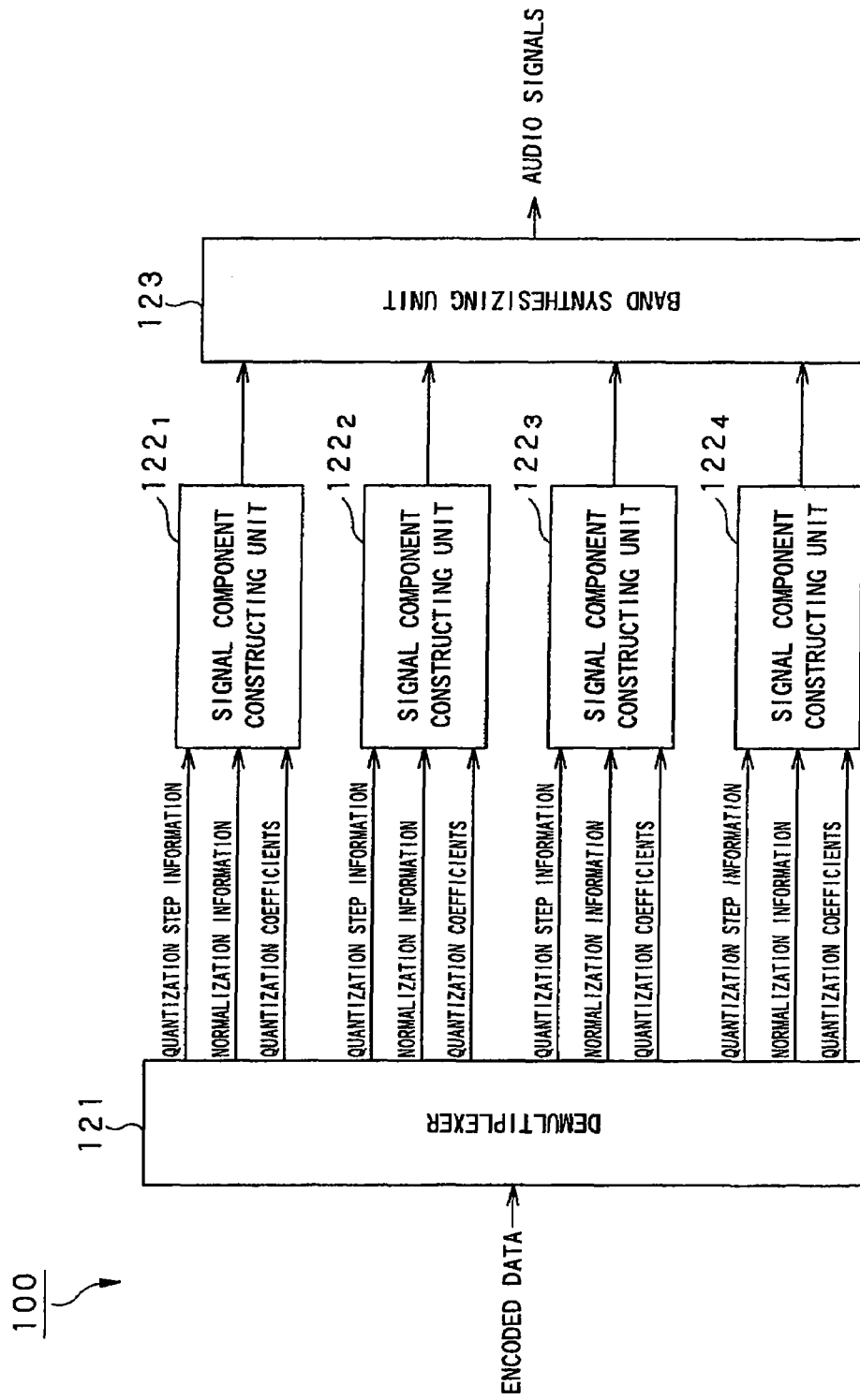
FIG. 2 illustrates the structure of a conventional decoding apparatus.

Referring to the drawings, a certain preferred embodiment of the present invention is explained in detail. In this embodiment, the present invention is applied to an encoding apparatus and a decoding apparatus in which audio signals, for example, are encoded with high efficiency encoding and transmitted and in which the decoder side receives and decodes the transmitted signals. Although it is assumed in the following explanation that the audio signals are encoded with high efficiency encoding, this is merely illustrative and the signals may, for example, be video signals.

Figure 3:
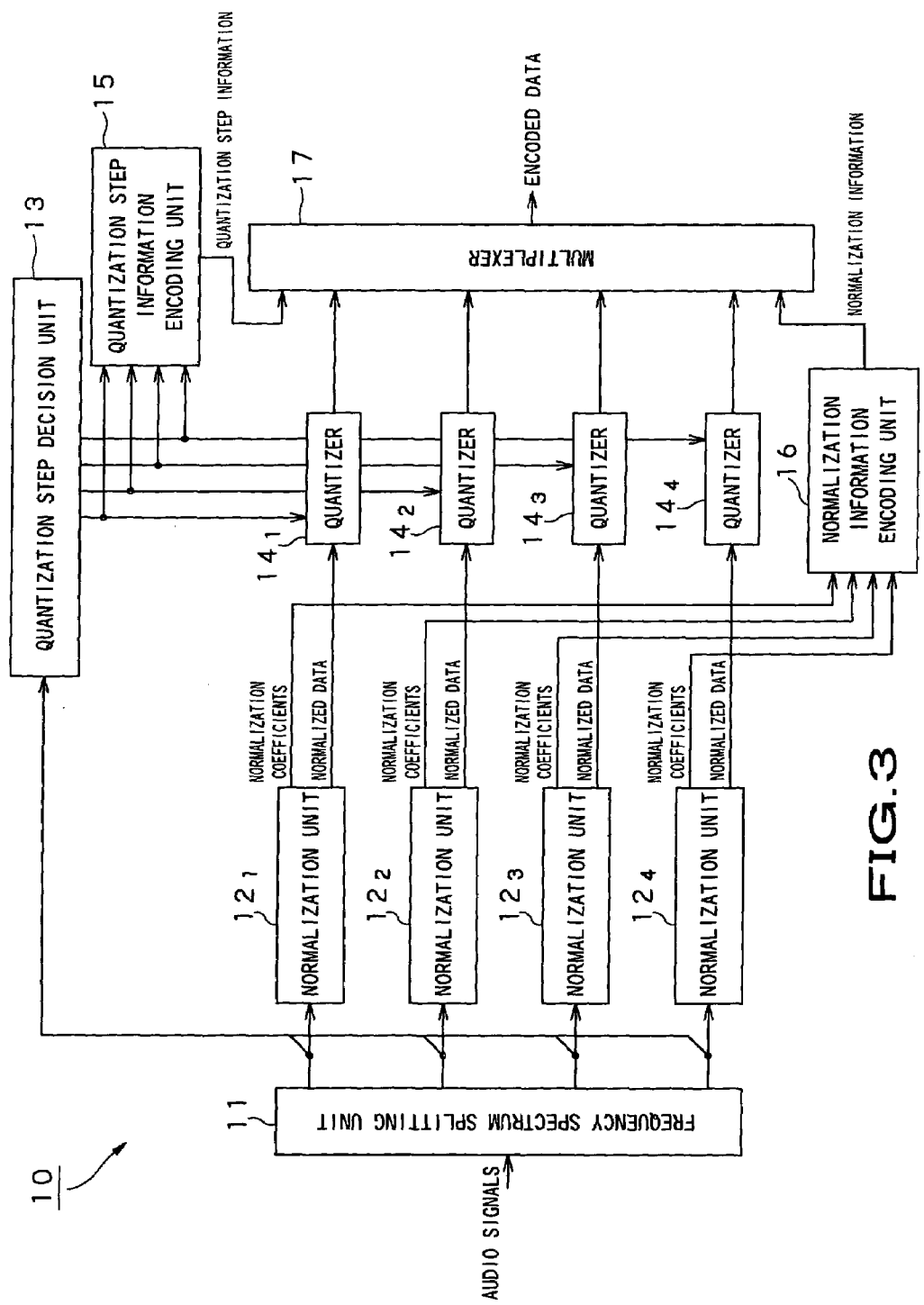
FIG. 3 illustrates the structure of an encoding apparatus embodying the present invention.

FIG. 3 shows the structure of an encoding apparatus 10 of the instant embodiment. In FIG. 3, audio signals to be encoded are input to a frequency spectrum splitting unit 11 where the signals are split into for example four frequency band signals.

It is noted that a filter such as a QMF (quadrature mirror filter) or PQF (polyphase quadrature filter) may be used for frequency spectrum splitting in the frequency spectrum splitting unit 11. Alternatively, the spectral signals obtained on orthogonal transform, exemplified by MDCT (modified discrete cosine transformation) may be grouped from one frequency band to another to effect frequency spectrum splitting.

Meanwhile, the bandwidth by which the audio signals are split into bands in the frequency spectrum splitting unit 11 may be uniform or may also be non-uniform in keeping with the critical bandwidth. The respective bands are herein referred to as encoding units. Although the audio signals are split into four encoding units, the number of the encoding units is not limited thereto.

The signals split into the four encoding units of the first to fourth encoding units are sent to a quantization step decision unit 13 every preset time block or frame. The signals of the first to fourth encoding units are also sent to normalization units $12_1$ to $12_4$.

The normalization units $12_1$ to $12_4$ extract the signal component with the maximum absolute value from the respective signal components making up the signals of each of the input first to fourth encoding units, and set the coefficient associated with the maximum absolute value as the normalization coefficient of each of the first to fourth encoding units. In the normalization units $12_1$ to $12_4$, the respective signal components forming the signals of the first to fourth encoding units are divided by values associated with the first to fourth normalization coefficients for normalization. Thus, in this case, the normalized data, i.e., data obtained on normalization, are values within −1.0 to 1.0.

The normalized data are output from the normalization units $12_1$ to $12_4$ to quantization units $14_1$ to $14_4$. The normalization coefficients of the first to fourth encoding units are output from the normalization units $12_1$ to $12_4$ to a normalization information encoding unit 16 so as to be encoded by a method as later explained before being output to a multiplexer 17.

The quantization units $14_1$ to $14_4$ are supplied from each of the normalization units $12_1$ to $12_4$ with the normalized data of the first to fourth encoding units. The quantization units $14_1$ to $14_4$ are also supplied from the quantization step decision unit 13 with the quantization step information used for commanding the quantization step applied in quantizing the data for normalization of the first to fourth encoding units.

That is, the quantization step decision unit 13 decides on the quantization step used in quantizing the data for normalization of the first to fourth encoding units, based on signals of the first to fourth encoding units from the frequency spectrum splitting unit 11. The quantization step decision unit 13 also outputs the quantization step information of the first to fourth encoding units, corresponding to the quantization step, to the quantization units $14_1$ to $14_4$ and to a quantization step information encoding unit 15. This quantization step information encoding unit 15 encodes the quantization step information, as later explained, to output the encoded quantization step information to the multiplexer 17.

The quantization units $14_1$ to $14_4$ quantize the data for normalization of the first to fourth encoding units, with the quantization step corresponding to the quantization step information of the first to fourth encoding units, by way of encoding, to output the resulting quantization coefficients of the first to fourth encoding units to multiplexer 17. The multiplexer 17 encodes the quantization coefficients of the first to fourth encoding units and multiplexes the so encoded quantization coefficients along with the quantization step information encoded in the quantization step information encoding unit 15 and with the normalization information encoded in the normalization information encoding unit 16. The encoded data, obtained as an output of the multiplexer 17, is transmitted over a transmission path, or recorded on a recording medium, not shown.

With the encoding apparatus 10 of the instant embodiment, the audio signals, which is the main information as the direct subject-matter of encoding, are encoded independently of the quantization step information and the normalization information, as the subsidiary information which is not the direct subject-matter of encoding.

Figure 4:
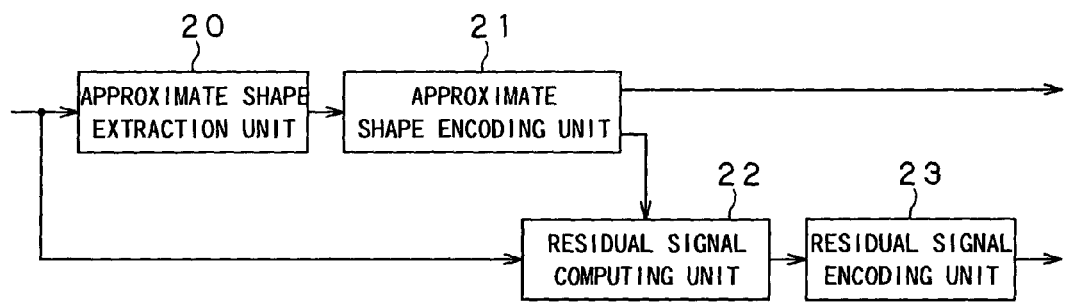
FIG. 4 illustrates a conceptual structure of a quantization step information encoding unit in the encoding apparatus.

The conceptual structure of the above-described quantization step information encoding unit 15 is shown in FIG. 4. In the following explanation, the number of the encoding units is 12, in distinction from 4 of the embodiment shown in FIG. 3.

Referring to FIG. 4, an approximate shape extraction unit 20 is supplied as input with the quantization step information, from one quantization step, associated with the aforementioned encoding unit, to another, and extracts the approximate shape to send the so extracted shape to an approximate shape encoding unit 21. The approximate shape encoding unit 21 sends the encoded approximate shape information to a residual signal computing unit 22, while sending the encoded approximate shape information to the multiplexer 17 of FIG. 3 as the quantization step information.

The residual signal computing unit 22 computes the quantization error in the approximate shape encoding unit 21 to send the computed quantization error to a residual signal encoding unit 23. The residual signal encoding unit 23 encodes the quantization error supplied from the residual signal computing unit 22 to send the encoded quantization error to the multiplexer 17 of FIG. 3 similarly as the quantization step information.

While a large variety of techniques may be used for extracting the approximate shape of the quantization step information in the approximate shape extraction unit 20, the following explanation is based on the use of a technique in which a representative value is found from one unitary quantization unit number to another and used as the approximate shape of the quantization step information.

The specified processing in each part of the quantization step information encoding unit 15 is explained in detail, using the flowchart shown in FIGS. 5 to 8.

Figure 5:
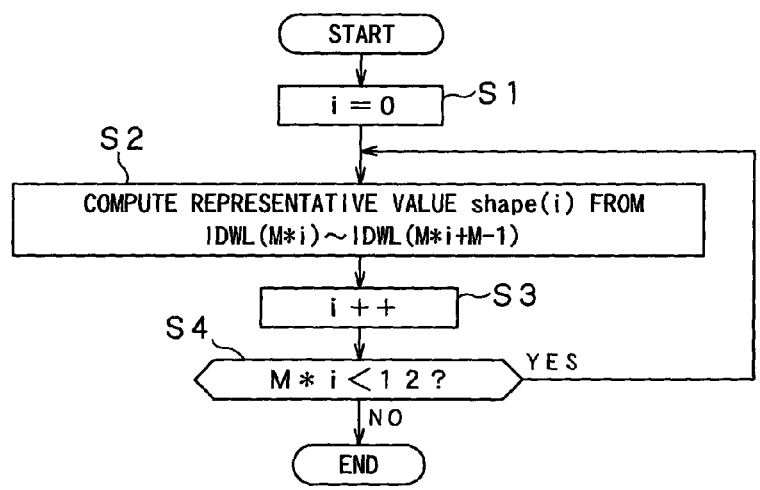
FIG. 5 is a flowchart for illustrating an approximate shape extraction unit of the quantization step information encoding unit.

First, the processing in the approximate shape extraction unit 20 of FIG. 4 is shown in FIG. 5, in which i, IDWL, shape and M denote the count value, the quantization step information, representative values of the quantization step information and the unit number of the quantization units, according to which the quantization step information is grouped in finding the representative values, respectively. Meanwhile, the value of M may be decided on arbitrarily provided that the value on the side encoder is matched to that on the side decoder, and may be fixed or variable, as desired. In FIG. 5, a fixed value is used as an example.

First, in a step S1, the value of the counter i is initialized at 0. In the second step S2, a representative value of the quantization step information is calculated from one unit number of the quantization units M to another. As this representative value, the maximum value or the average value may routinely be used.

In the next step S3, the count value i is incremented by one. In the next step S4, it is verified whether or not the value of M*i is less than 12 which is the number of the entire quantization units. If the value of M*1 is less than 12, program reverts to step S2 to continue the processing. If, in the step S4, the value of M*1 is not less than 12, processing comes to a close.

The approximate shape of the quantization step information, extracted as described above, is quantized and encoded in the approximate shape encoding unit 21 shown in FIG. 4.

Figure 6:
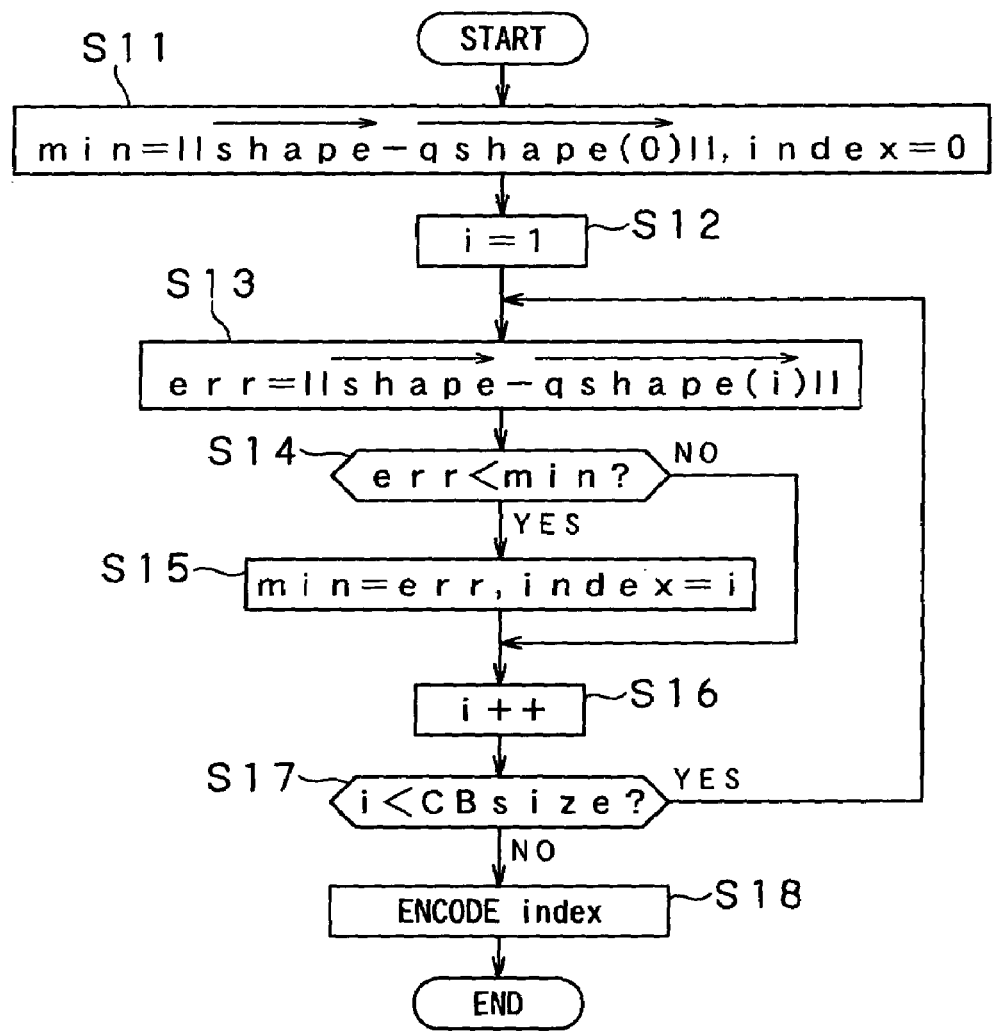
FIG. 6 is a flowchart for illustrating the operation in the approximate shape quantization unit of the quantization step information encoding unit.

The flowchart as to quantization and encoding of the quantization step information is shown in FIG. 6, in which i, shape, qshape(i), err, min, index and CBsize denote the count value, approximate shape vector, quantized approximate shape vector in the ith index, an error (in distance) between the approximate shape vector and the quantized approximate shape vector, the minimum error value, an index of the quantized value of the approximate shape vector and the size of the codebook of the quantized approximate shape vector (number of indexes), respectively.

First, in a step S11 in FIG. 6, the minimum error value min is initialized, as being the distance of the approximate shape vector shape and the quantized approximate shape vector qshape (0) and the index index of the quantized approximate shape vector is initialized at 0. It is assumed that the qshape of the quantized approximate shape vector has been formulated on pre-learning and saved as a codebook.

In the next step S12, the count value is initialized at 1. In the next step S13, a quantization error err between the approximate shape and the quantized approximate shape vector qshape (i) is calculated.

In the next step S14, it is verified whether or not the quantization error err is less than the minimum error value. If the quantization error is less than the minimum error value min, processing transfers to step S15 to substitute a quantization error err into the minimum value of the quantization error min as well as to substitute i into the value of the quantized index index. If, in a step S14, the quantization error err is not less than the minimum error value min, processing transfers to step S16.

In the step S16, the count value is incremented by one. In the next step S17, it is verified whether or not the count value i is less than the codebook size CBsize. If the count value i is less than the codebook size CBsize, program reverts to step S13 to continue the processing. If, in the step S17, the count value i is not less than the codebook size CBsize, the quantized value index index is encoded in a step S18 to terminate the processing.

In this manner, the approximate shape encoding unit 21 shown in FIG. 4 calculates, for each index, the error (in distance) between the quantized approximate shape vector and the approximate shape vector, in each index of the codebook, and encodes the index which minimizes the error.

Figure 7:
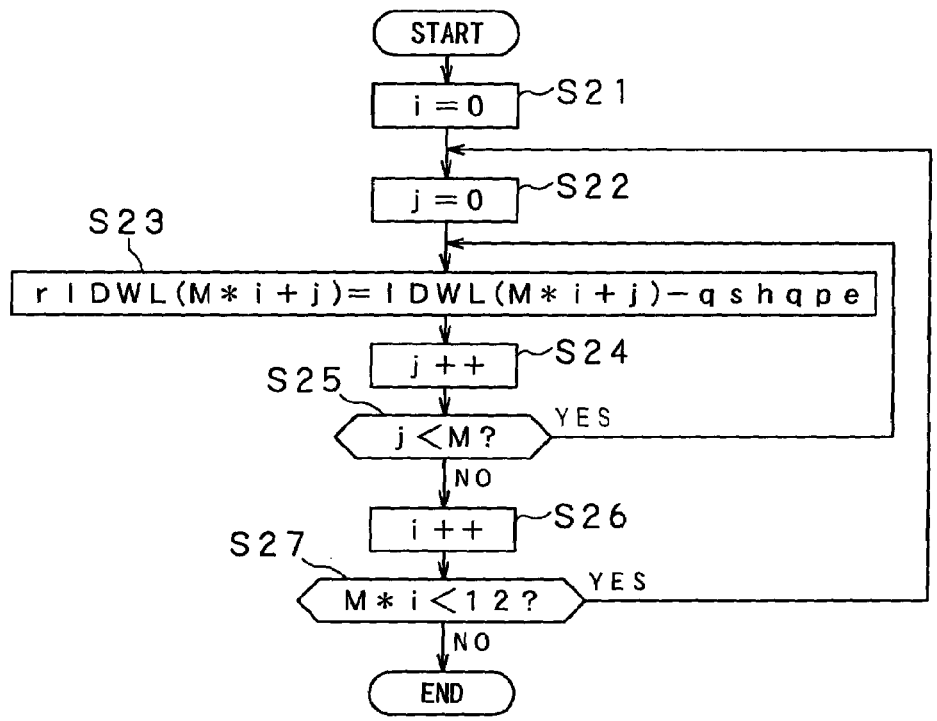
FIG. 7 is a flowchart for illustrating the operation in a residual signal computing unit of the quantization step information encoding unit.

The residual signal computing unit 22 shown in FIG. 4 calculates the residual signals of the quantization step information, as shown in FIG. 7. In FIG. 7, i and j denote count values, while IDWL, qshape, rIDWL and M denote the quantization step information, quantized approximate shape vector, index of the quantized approximate shape vector, residual signals of the quantization step information and the number of the unitary quantization units which group the quantization step information together.

In FIG. 7, the count value i is set to 0. In a step S22, the value of the count j is initialized to 0.

In the next step S23, the residual signals of the quantization step information are calculated. The residual signals of the quantization step information may be found by subtracting the values of the quantized approximate shape vector, corresponding to the index encoded in the approximate shape encoding unit 21 shown in FIG. 4, from the quantization step information IDWL.

In the next step S24, the count value is incremented by one. In the next step S25, it is checked whether or not the value of j is less than M. If the value of j is less than M, program reverts to step S23 to calculate the value of the residual signals of the quantization step information. If the value of j is not less than M, processing transfers to step to increment the count value i by one.

At step S27, it is checked whether or not the value of M*1 is less than 12 which is the total number of the quantized units. If the value of M*1 is less than 12, program reverts to step S22 to continue the processing. If, in the step S27 the value of M*1 is not less than 12, processing comes to a close.

Figure 8:
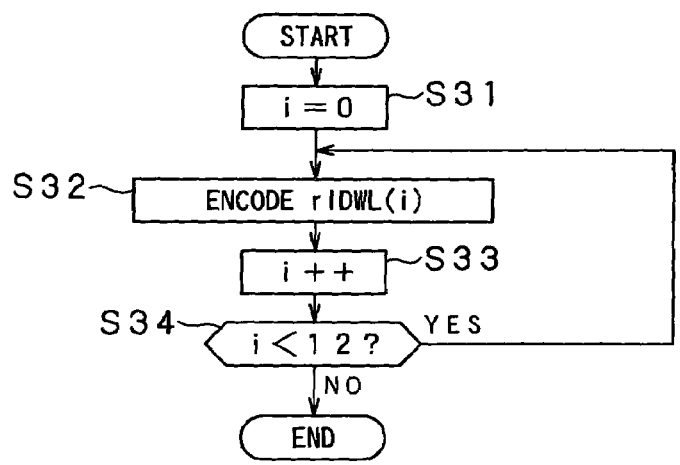
FIG. 8 is a flowchart for illustrating a specified example of the operation in a residual signal encoding unit of the quantization step information encoding unit.

The residual signals of the quantization step information, thus calculated, are encoded, as shown in FIG. 8, in the residual signal encoding unit 23 shown in FIG. 4. In FIG. 8, i and rIDWL(i) denote the count value and the residual signals of the quantization step information, respectively.

First, in a step S31, the count value i is initialized to 0. In the next step S32, rIDWL(i) is encoded. At this time, encoding may be achieved efficiently if a table of variable codeword table is provided and used for encoding.

In the next step S33, the count value i is incremented by one. In the next step S34, it is verified whether or not the count value i is less than 12 which is the total number of the quantized units. If the count value i is less than 12 which is the total number of the quantized units, program reverts to step S32 to continue the processing. If, in the step S34, the count value i is less than 12 which is the total number of the quantized units, processing is terminated.

By employing the encoded residual signals of the quantization step information and the encoded index of the codebook, obtained as described above, as the quantization step information, the quantization step information can be compressed efficiently.

A specified example of compression of the quantization step information is now explained with reference to FIGS. 9 and 10A to 10C. In this specified example, the number of the unitary quantization units M, into which the quantization step information (IDWL) is grouped together, is three, and an average value thereof is found as being a representative value, to find an approximate shape (shape). In the following explanation, it is assumed that the quantization step information is encoded with three bits.

It is assumed that the quantization step information for each quantization unit (QU) is supplied, as shown in FIG.

10A. Since the quantization step information of the quantization unit numbers 0 to 2 is 7, 7 and 6, respectively, the representative value is an average value thereof, or 7. If this is found for the totality of the quantization step information, the approximate shape vector is the four-dimensional vector (7,4,2,1).

Figure 9:
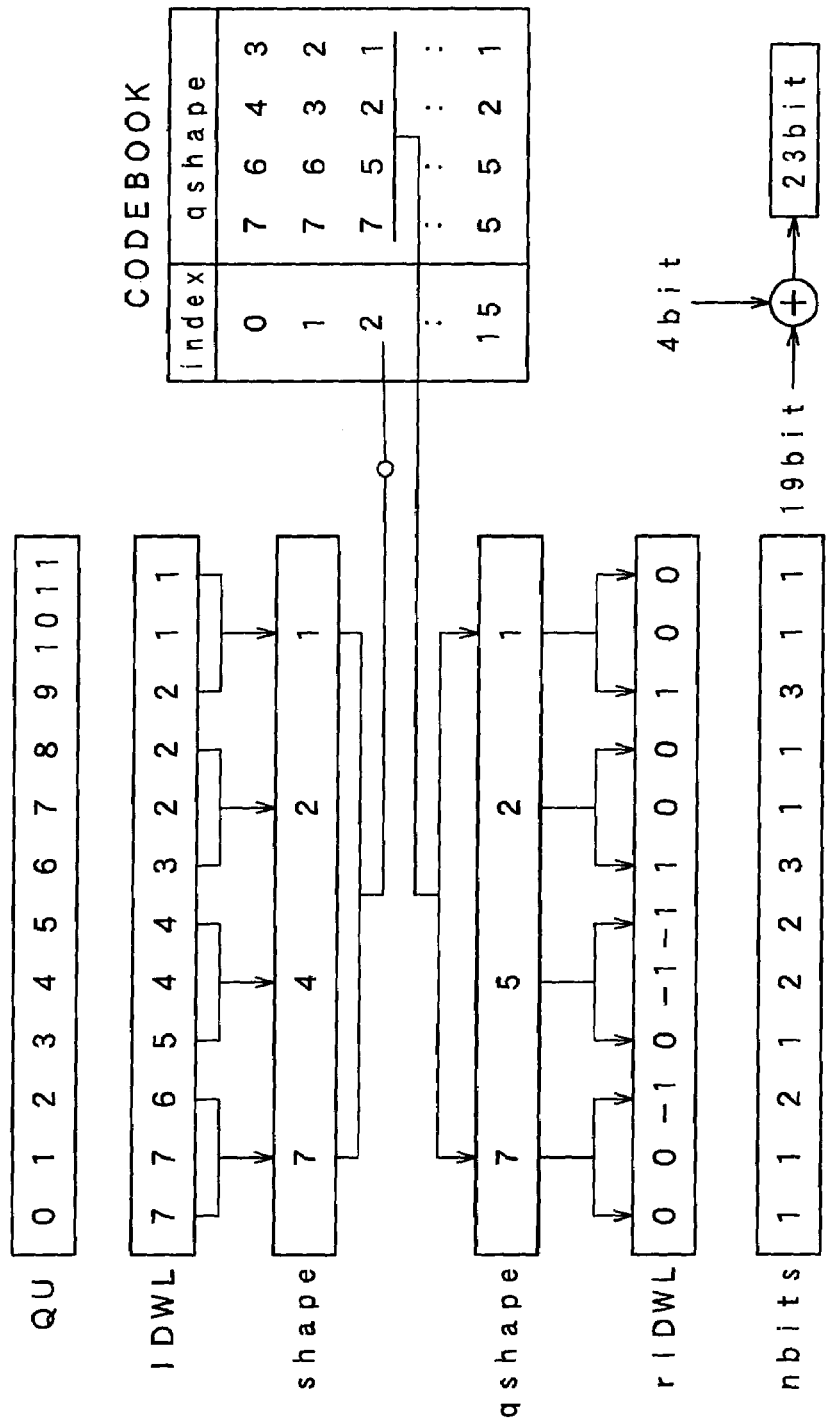
FIG. 9 illustrates a specified example of compression of the quantization step information in the quantization step information encoding unit.
Figure 10A:
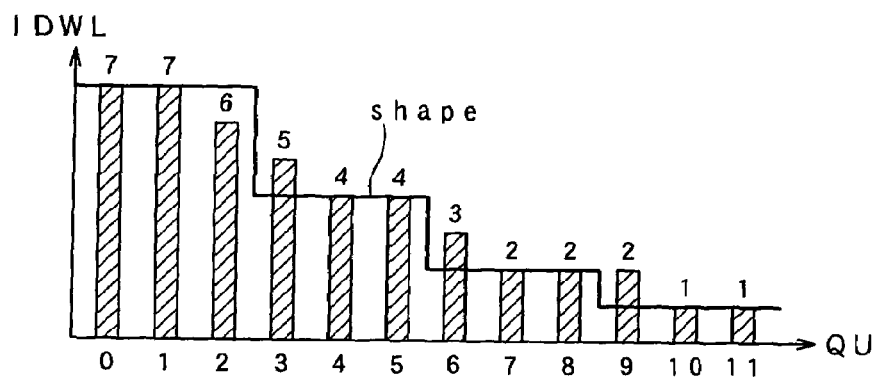
FIGS. 10A to 10C illustrate specified examples of compression of the quantization step information in the quantization step information encoding unit, FIG. 10A showing the quantization step information and an average value thereof, FIG. 10B showing the quantization step information and the quantization profile vector and FIG. 10C showing the residual signal of the quantization step information.
Figure 10B:
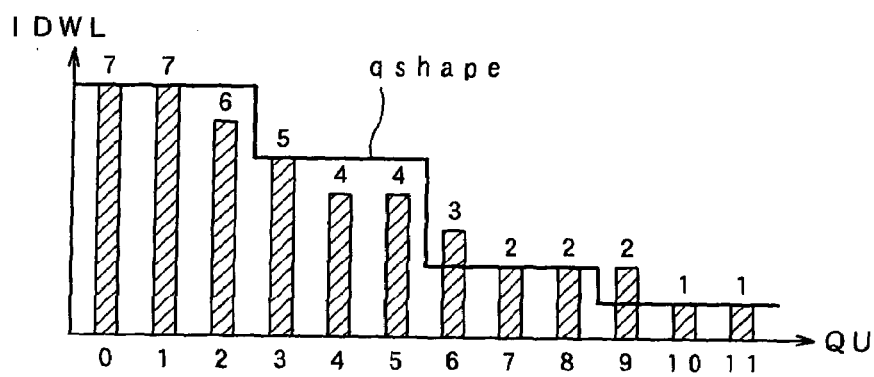

If, in each index of the codebook, shown in FIG. 9, the distance between this approximate shape vector and the quantized approximate shape vector qshape is calculated, it may be seen that the distance to the quantized approximate shape vector (7,5,2,1) of the index 2 is closest. At this time, the quantization step information (IDWL) and the quantized approximate shape vector (qshape) are as shown in FIG. 10B.

Figure 10C:
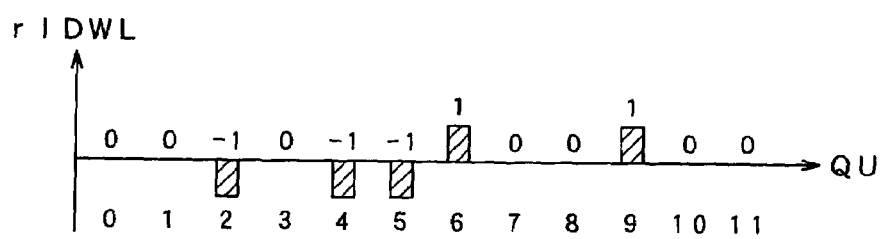

The residual signals of the quantization step information (rIDWL) may be found from the quantized approximate shape vector and the quantization step information. That is, the residual signals of the quantization step information may be found by subtracting the value of the quantized approximate shape vector from the quantization step information. The residual signals of the quantization step information are as shown in FIG. 10C.

If the residual signals of the quantization step information are variable-length encoded, using the table of the variable length codewords, shown in FIG. 11, the number of bits is 19. Since the index of the quantized approximate shape vector shown in FIG. 9 may be represented by four bits, the number of bits following encoding of the quantization step information is the sum of the numbers of bits, or 23. Since 36 bits are required if no compression is used, compression by 13 bits becomes possible with the use of the technique of the instant embodiment.

Although variable length encoding is applied in the instant embodiment to the residual signals of the quantization step information, the variable length encoding may also be applied to differential values in the frequency direction of the residual signals of the quantization step information. Specifically, the residual signals of the quantization step information of neighboring quantization units, neighboring channels or between neighboring time points, or the residual signals of the normalization information of neighboring quantization units, neighboring channels or between neighboring time points in many cases are close to one another. Thus, if the difference values in for example the frequency direction is calculated, marked offset is produced in the probability of occurrence. In particular, the probability is high that the difference value is in the vicinity of 0. Consequently, the number of encoding bits may be decreased by allocating the shorter codes to difference values with high probability of occurrence.

Various other techniques than the variable length encoding may be used. For example, since the residual signals of the quantization step information tend to assume higher values and low values for the low frequency range and for high frequency range, respectively, it is possible to narrow the dynamic range of the entire frequency spectrum by applying the weighting of decreasing the magnitudes for the low frequency range or of increasing the magnitudes for the high frequency range, thereby achieving the encoding with a smaller number of bits. In addition, it is a frequent occurrence that the information distribution range becomes narrow for encoding units in excess of a certain frequency band, so that, by separately encoding the boundary quantization unit number, it is possible to encode the information in excess of the boundary frequency band with a smaller number of bits.

It is also possible to specify the gain and the shape separately in specifying the codebook used for quantizing the approximate shape vector of the quantization step information. In this manner, encoding may be achieved more efficiently using a codebook of a small size.

Although the case of the quantization step information has been explained in the foregoing, similar techniques may be used for the compressing the normalization information. Briefly, the normalization information encoding unit 16, shown in FIG. 3, extracts the approximate shape of the normalization information, from one quantization unit to another, quantizes and encodes the approximate shape of the normalization information extracted to output the resulting shape to the multiplexer 17 shown in FIG. 3. The quantization error also is encoded and output as the normalization information to the multiplexer 17 shown in FIG. 3.

A specified example of compression of the normalization information is explained with reference to FIGS. 12 and 13A to 13C. In the present example, the number M of the unitary quantization units, by which the normalization information (IDSF) is grouped together, is 3, such that the normalization information is grouped three-by-three and an average value of each group is found as a representative value to find the approximate shape (shape). In the following explanation, it is assumed that encoding is to be executed in six bits.

Figure 13A:
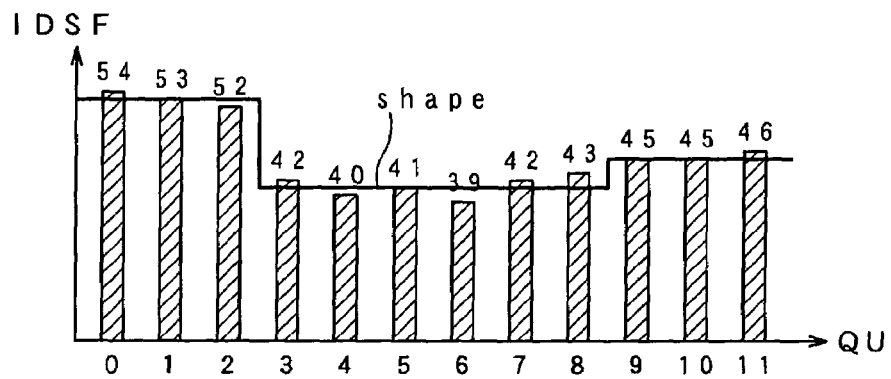
FIGS. 13A to 13C illustrate specified examples of compression of the normalization information in the normalization information encoding unit, FIG. 13A showing the normalization information and an average value thereof, FIG. 13B showing the normalization information and the approximate quantization shape vector and FIG. 13C showing the normalization information residual signal.

For example, it is assumed that the normalization information is given, every quantization unit (QU), as shown in FIG. 13A. Since the normalization information for the quantization unit numbers 0 to 2 is 54, 53, 52, the representative value is the average value thereof, that is 53. If this is found from the totality of the normalization information, the approximate shape vector is the four-dimensional vector (53, 41, 41, 45).

Figure 12:
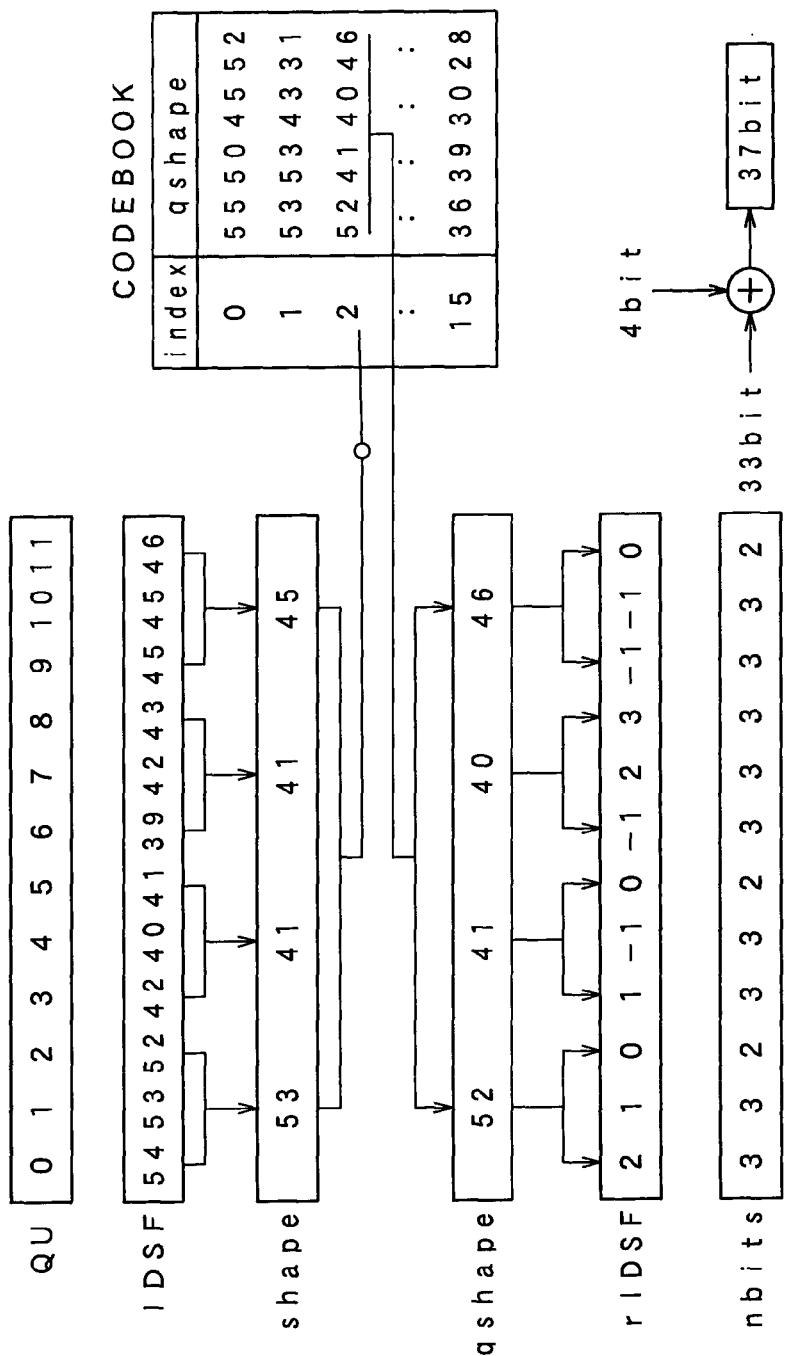
FIG. 12 illustrates a specified example of compression of the normalization information in the normalization information encoding unit.
Figure 13B:
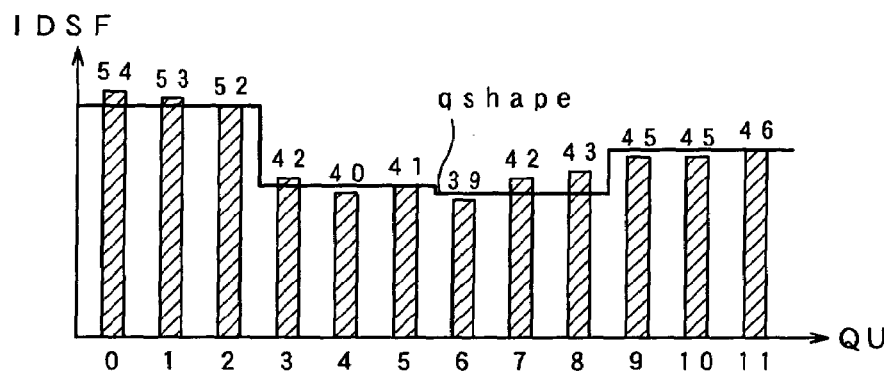

If an error (distance) between the approximate shape vector and the quantized approximate shape vector (qshape) is computed for index of the codebook shown in FIG. 12, it may be seen that the distance to the quantized approximate shape vector of the index 2 (52, 41, 40, 46) is closest. In this case, the quantization step information (IDSF) and the quantized approximate shape vector (qshape) are as shown in FIG. 13B.

Figure 13C:
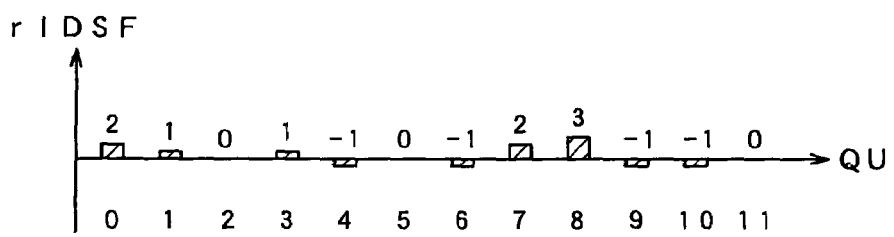

The residual signals of the normalization information (rIDSF) may be found from the quantized approximate shape vector and the normalization information. That is, the residual signals of the normalization information may be found by subtracting the value of the quantized approximate shape vector from the normalization information. The residual signals of the normalization information are as shown in FIG. 13C.

Figures 14, 15:
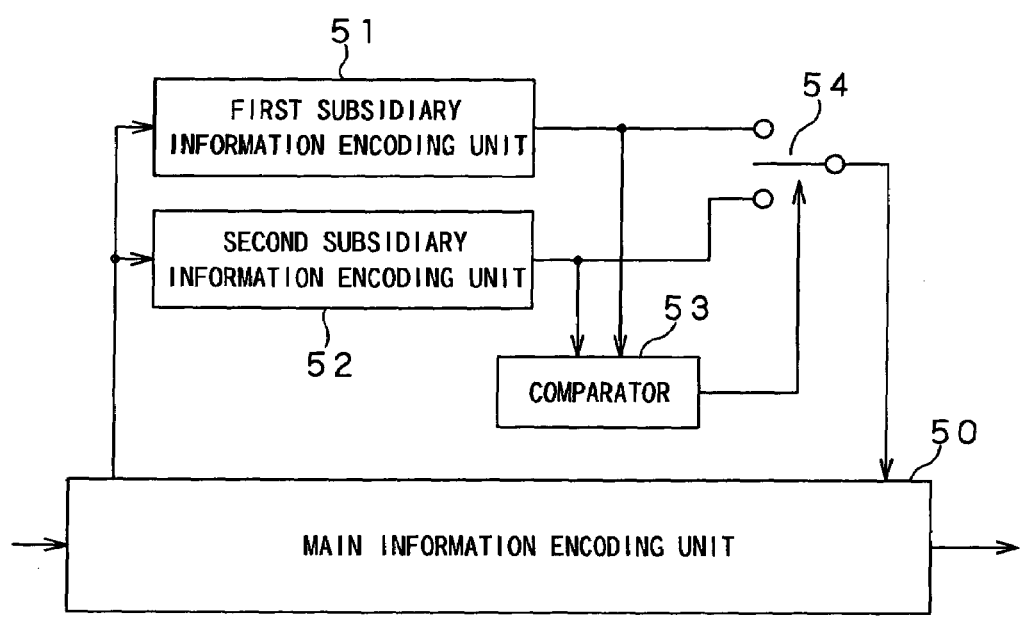
FIG. 14 illustrates an example of variable length codeword table for encoding the normalization information residual signal.
FIG. 15 illustrates an example of an encoding apparatus having an encoding unit for encoding in accordance with another encoding format.

If the residual signals of the normalization information are variable-length encoded, using the table of the variable length codewords, shown in FIG. 14, the number of bits is 33. Since the index of the quantized approximate shape vector shown in FIG. 9 may be represented by four bits, the number of bits following encoding of the quantization step information is the sum of the numbers of bits, or 37. Since 72 bits are required if no compression is used, compression by 35 bits becomes possible with the use of the technique of the instant embodiment.

Thus, with the encoding apparatus 10 of the instant embodiment, the subsidiary information, such as quantization step information or normalization information, can be compressed efficiently without loss of the information. However, if the residual signals of the quantization step information in the variable length codeword table shown in FIG. 11 are not comprised in many cases within the range of −1 to +1, depending on the properties of the input signals, it may be presumed that the number of bits may be smaller if the quantization step information is encoded in a usual fashion. Thus, it would be more realistic to provide an encoding unit for encoding the subsidiary information by another encoding system and to compare the code volume in case of using the encoding system of the instant embodiment to that in case of using the other encoding system by a comparator to select the encoding system with a smaller code volume by a selector.

In this case, the encoding apparatus includes a main information encoding unit 50, a first subsidiary information encoding unit 51, a second subsidiary information encoding unit 52, a comparator 53, as comparator means, and a switch 54, as selector means, as shown in FIG. 15. It is noted that the main information encoding unit 50 is equivalent to the frequency spectrum splitting unit 11, normalization units 12$_1$ to 12$_4$, quantization step decision unit 13, quantization units 14$_1$ to 14$_4$ and the multiplexer 17 shown in FIG. 3. The first subsidiary information encoding unit 51 operates by a technique of the instant embodiment on the subsidiary information, such as quantization step information or normalization information, that is extracts and encodes the approximate shape, while the second subsidiary information encoding unit 52 encodes the subsidiary information in the usual fashion.

The comparator 53 compares the code volume in the first subsidiary information encoding unit 51 to that in the second subsidiary information encoding unit 52 and controls the switch 54 to select the unit with the smaller code volume. This routes the selected as-encoded subsidiary information to the main information encoding unit 50.

Figure 16:
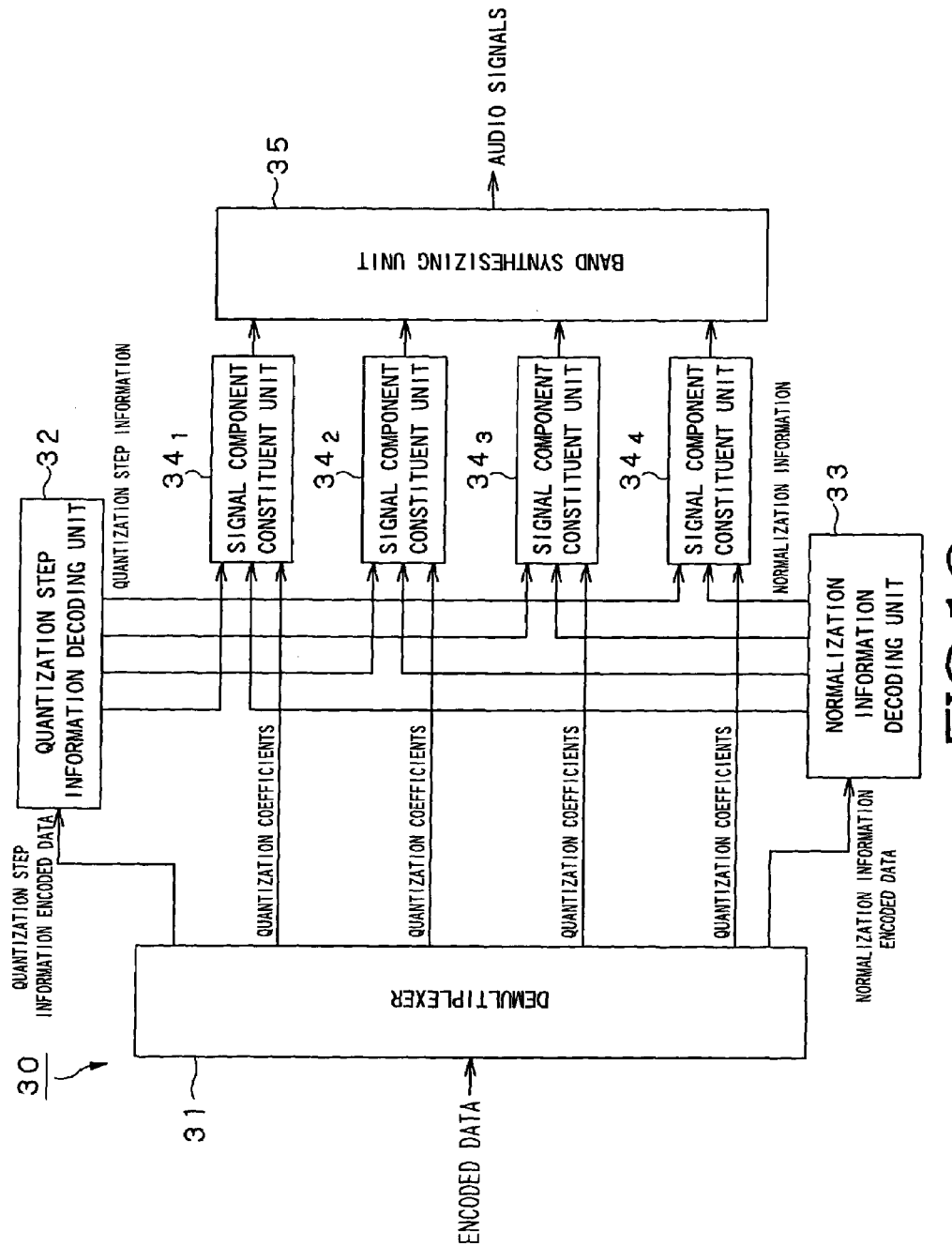
FIG. 16 illustrates the structure of a decoding apparatus embodying the present invention.

FIG. 16 shows the structure of a decoding apparatus of the instant embodiment. In this figure, the encoded data is input to and decoded by a demultiplexer 31 so as to be separated into the quantization coefficients, quantization step information and the normalization information. The quantization coefficients of the first to fourth encoding units are routed to signal component constituent units 34$_1$ to 34$_4$ associated with the respective encoding units. The quantization step information and the normalization information are decoded by a quantization step information decoding unit 32 and a normalization information decoding unit 33, respectively, so as to be then routed to the signal component constituent units 34$_1$ to 34$_4$ associated with the respective encoding units.

In the signal component constituent unit 34$_1$, the quantization coefficients of the first encoding unit are inverse-quantized with the quantization step associated with the quantization step information of the first encoding unit and are thereby turned into normalized data of the first encoding unit. In the signal component constituent unit 34$_1$, the normalized data of the first encoding unit are multiplied with a value corresponding to the normalization information of the first encoding unit, whereby the signals of the first encoding unit are decoded and output to a band synthesizing unit 35.

Similar operations are carried out in the signal component constituent units 34$_2$ to 34$_4$, whereby the signals of the second to fourth units are decoded and output to the band synthesizing unit 35. The band synthesizing unit 35 synthesizes the bands of the first to fourth encoding units to restore the original audio signals.

Figure 17:
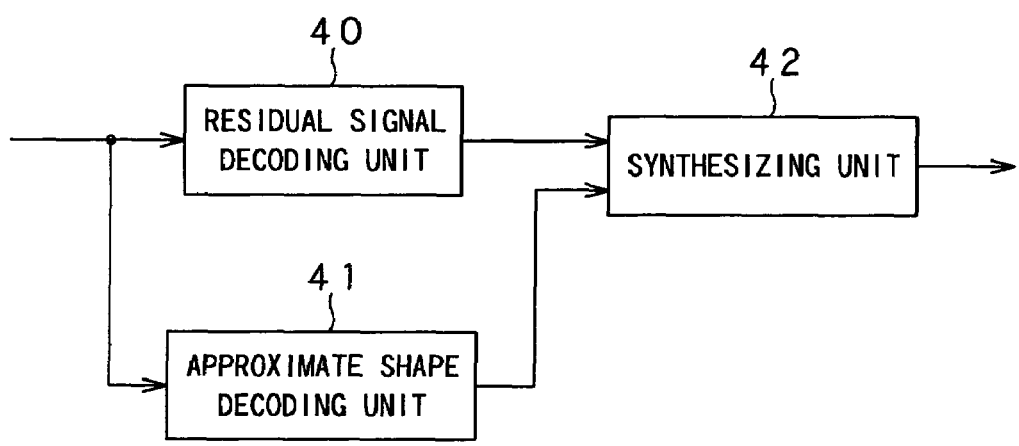
FIG. 17 illustrates a conceptual structure of a quantization step information decoding unit in the decoding apparatus.

The conceptual structure of the quantization step information decoding unit 32 is shown in FIG. 17, from which it is seen that the input residual signals of the quantization step information are decoded and supplied to a synthesis unit 42. This synthesis unit 42 synthesizes the approximate shape information and the residual signals of the quantization step information to form the quantization step information which then is supplied to the signal component constituent units 34$_1$ to 34$_4$, associated with the respective quantization units.

With the instant embodiment, described above, in which the approximate shape of the subsidiary information, such as quantization step information or the normalization information, is quantized and the quantization error (residual signals) are variable-length encoded, it is possible to curtail the number of bits used for encoding the subsidiary information. The number of bits, thus curtailed, can be allocated for encoding the main information, such as audio signals, thereby improving the quality of the encoded sound.

The present invention is not limited to the above-described embodiment but may be changed in diversified fashion without departing from its scope.

For example, the approximate shape information used is the representative value from one set of a given number of unitary quantization units to another in extracting the approximate shape of the quantization step information and the normalization information. This, however, is merely illustrative, such that an LPC envelope, an LSP envelope, as found from linear prediction coefficients, or a cepstrum envelope, obtained by transforming the log of the power spectrum into time axis, may also be used as the approximate shape information, as will now be explained only briefly.

It is assumed that, if the waveform of audio signals is {x(t)}, where t is an integer, the relationship represented by the following equation (1):

$$e(t)=x(t)-\alpha(1)x(t-1)-\ldots -\alpha(p)x(t-p) \quad (1)$$

holds between the value x(t) at the current time point and past p values neighboring to the value at the current time point.

With this linear difference equation, the value x(t) at the current time point can be predicted from the past values by linear prediction by finding α(i) which minimizes the prediction error e(t) (1 ≦α≦p). That is, if the value of linear prediction of x(t) is x'(t), x'(t) may be represented by the following equation (2):

$$x'(t) = \sum_{i=1}^{P} \alpha(i)x(t-i) \quad (2)$$

while the prediction error e(t) may be represented by the following equation (3):

$$e(t)=x(t)-x'(t) \quad (3).$$

Meanwhile, this α(i) is termed the linear prediction coefficient (LPC). This LPC may be found by finding an auto-correlation function r(τ) and solving a simultaneous linear equation for this r(τ).

Since the normalization coefficient is the maximum value of the absolute value of the spectrum in each quantization unit, this normalization coefficient or a squared value thereof may be deemed to be a maximum value of the power spectrum. Since the inverse Fourier transform represents an auto-correlation function, the linear prediction coefficient can be found from the normalization coefficient.

The value of the LSP (linear spectral pair) as found from the linear prediction coefficient may be used as the approximate shape of the normalization coefficient.

The cepstrum is obtained by taking the log of the power spectrum and by inverse Fourier transforming the resulting log. Consequently, the cepstrum may be found from the normalization coefficient by taking the log of the normalization coefficient or its square value and by inverse Fourier transforming the resulting log value, while the approximate shape of the normalization coefficient may be represented by employing the lower order number.

The approximate shape of the quantization step information may similarly be represented by LPC, LSP or the cepstrum by provisionally deeming the quantization step information to be the power spectrum value.

INDUSTRIAL APPLICABILITY

With the present invention, described above, it is possible to curtail the number of bits used for encoding the subsidiary information by quantizing the approximate shape of the subsidiary information and by variable length encoding the quantization error (residual signals). Consequently, the number of bits curtailed may be allocated to the encoding of the main information, such as audio signals, thereby improving the quality of the encoded sound.

The invention claimed is:

1. An encoding apparatus for encoding the main information of audio and/or video signals, which is the direct subject-matter of encoding, and the subsidiary information, which is not the direct subject-matter of encoding, said apparatus comprising:
approximate shape computing means for computing the approximate shape information of said subsidiary information;
approximate shape encoding means for quantizing and encoding said approximate shape information;
error computing means for computing the quantization error in said approximate shape encoding means; and
error encoding means for encoding said quantization error in a lossless fashion without losing the information; wherein
said approximate shape information encoded by said approximate shape encoding means and said quantization error encoded by said error encoding means are output.

2. The encoding apparatus according to claim 1 wherein said approximate shape computing means finds the approximate shape of said subsidiary information by linear prediction coefficients of said subsidiary information.

3. The encoding apparatus according to claim 1 wherein said approximate shape computing means finds the approximate shape of said subsidiary information by cepstrum coefficients of said subsidiary information.

4. The encoding apparatus according to claim 1 wherein said approximate shape computing means computes a representative value of said subsidiary information with respect to each preset unitary unit to find an approximate shape of said subsidiary information.

5. The encoding apparatus according to claim 4 wherein said representative value is an average value.

6. The encoding apparatus according to claim 4 wherein said representative value is a maximum value.

7. The encoding apparatus according to claim 1 wherein said approximate shape encoding means vector-quantizes the approximate shape information as computed by said approximate shape computing means.

8. The encoding apparatus according to claim 7 wherein said approximate shape encoding means encodes such an index of a codebook, provided at the outset for encoding the approximate shape information, which index will minimize the quantization error.

9. The encoding apparatus according to claim 1 wherein said approximate shape computing means computes the difference between said subsidiary information and the approximate shape information encoded by said approximate shape encoding means.

10. The encoding apparatus according to claim 1 wherein said error encoding means encodes said quantization error into variable length codewords.

11. The encoding apparatus according to claim 10 wherein said variable length codewords are composed of Huffman codes.

12. The encoding apparatus according to claim 1 wherein said subsidiary information is the normalization information.

13. The encoding apparatus according to claim 1 wherein said subsidiary information is the quantization step information.

14. The encoding apparatus according to claim 1 further comprising:
splitting means for splitting said audio and/or video signals into preset encoding units;
decision means for deciding on the normalization information and the quantization step information, from one encoding unit to another;
normalization means for normalizing said audio and/or video signals based on said normalization information;
quantization means for quantizing said audio and/or video signals based on said quantization step information; and
encoding means for encoding said audio and/or video signals in accordance with the encoding system associated with that for said quantization step information.

15. The encoding apparatus according to claim 1 further comprising:
comparator means for comparing the code volume by said error encoding means to the code volume by another encoding system for encoding said subsidiary information; and
selection means for selecting the code volume which has been found to be smaller on comparison by said comparator means.

16. An encoding method for encoding the main information of audio and/or video signals, which is the direct subject-matter of encoding, and the subsidiary information, which is not the direct subject-matter of encoding, said method comprising:
an approximate shape computing step of computing the approximate shape information of said subsidiary information;
an approximate shape encoding step of quantizing and encoding said approximate shape information;
an error computing step of computing the quantization error; and
an error encoding step of encoding said quantization error in a lossless fashion without losing the information; wherein
said approximate shape information encoded by said approximate shape encoding step and said quantization error encoded by said error encoding step are output.

17. A decoding apparatus for decoding encoded audio and/or video signals in which the approximate shape information of the subsidiary information that is not the direct subject-matter of encoding is encoded in an encoding apparatus and in which a quantization error in encoding the approximate shape information is encoded in a lossless fashion without losing the information, said approximate shape information and the quantization error being input to and decoded by the decoding apparatus, said decoding apparatus comprising:

error decoding means for decoding the quantization error of said subsidiary information;

approximate shape decoding means for decoding the approximate shape information of said subsidiary information; and synthesizing means for synthesizing the decoded quantization error and the decoded approximate shape information.

18. The decoding apparatus according to claim 17 wherein
said approximate shape information of said subsidiary information is found from linear prediction coefficients of said subsidiary information.

19. The decoding apparatus according to claim 17 wherein
the approximate shape of said subsidiary information is that found from the cepstrum coefficients of said subsidiary information.

20. The decoding apparatus according to claim 17 wherein
the approximate shape of said subsidiary information is that found by calculating the representative value of said subsidiary information with respect to each preset unitary unit.

21. The decoding apparatus according to claim 20 wherein
said representative value is an average value.

22. The decoding apparatus according to claim 20 wherein
said representative value is a maximum value.

23. The decoding apparatus according to claim 17 wherein
in encoding the approximate shape, the approximate shape information is vector-quantized.

24. The decoding apparatus according to claim 23 wherein
from a codebook for encoding the approximate shape, provided from the outset, an index of a codeword which minimizes the quantization error is encoded.

25. The decoding apparatus according to claim 17 wherein
said quantization error is the difference between the subsidiary information and the encoded approximate shape information.

26. The decoding apparatus according to claim 17 wherein
in encoding said quantization error, said quantization error is encoded into codewords of a variable length.

27. The decoding apparatus according to claim 26 wherein
the codewords of a variable length are composed of Huffman code.

28. The decoding apparatus according to claim 17 wherein
said subsidiary information is the normalization information.

29. The decoding apparatus according to claim 17 wherein
said subsidiary information is the quantization step information.

30. The decoding apparatus according to claim 17 further comprising:

separating means for separating the encoded audio and/or video signals into quantization coefficients, quantization step information and normalization information;

decoding means for decoding said quantization coefficients, based on the decoded quantization step information and the decoded normalization information, from one preset encoding unit to another; and restoration means for synthesizing the decoded quantization coefficients from one encoding unit to another to restore said audio and/or video signals.

31. A decoding method for decoding encoded audio and/or video signals in which the approximate shape information of the subsidiary information that is not the direct subject-matter of encoding is encoded in an encoding apparatus and in which a quantization error in encoding the approximate shape information is encoded in a lossless fashion without losing the information, said approximate shape information and the quantization error being input and decoded, said decoding method comprising:

an error decoding step of decoding the quantization error of said subsidiary information;

an approximate shape decoding step of decoding the approximate shape information of said subsidiary information; and a synthesizing step of synthesizing the decoded quantization error and the decoded approximate shape information.

32. An encoding program for encoding the main information of audio and/or video signals, which is the direct subject-matter of encoding, and the subsidiary information, which is not the direct subject-matter of encoding, said encoding program comprising:

an approximate shape computing step of computing the approximate shape information of said subsidiary information;

an approximate shape encoding step of quantizing and encoding said approximate shape information;

an error computing step of computing the quantization error; and an error encoding step of encoding said quantization error in a lossless fashion without losing the information; wherein said approximate shape information encoded by said approximate shape encoding step and said quantization error encoded by said error encoding step are output.

33. An decoding program for decoding encoded audio and/or video signals, in which the approximate shape information of the subsidiary information that is not the direct subject-matter of encoding is encoded and in which a quantization error in encoding the approximate shape information is encoded in a lossless fashion without losing the information, said approximate shape information and the quantization error being input and decoded, said decoding program comprising:

an error decoding step of decoding the quantization error of said subsidiary information;

an approximate shape decoding step of decoding the approximate shape information of said subsidiary information; and a synthesis step of synthesizing the decoded quantization error and the decoded approximate shape information.

* * * * *